(12) United States Patent
Dekker et al.

(10) Patent No.: US 11,458,581 B2
(45) Date of Patent: Oct. 4, 2022

(54) HIGH-PRECISION LINEAR ACTUATOR

(71) Applicant: Nederlandse Organisatie voor toegepast-natuurwetenschappelijk onderzoek TNO, s-Gravenhage (NL)

(72) Inventors: Albert Dekker, Delft (NL); Anton Adriaan Bijnagte, Tricht (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 838 days.

(21) Appl. No.: 16/341,166

(22) PCT Filed: Oct. 18, 2017

(86) PCT No.: PCT/NL2017/050680
§ 371 (c)(1),
(2) Date: Apr. 11, 2019

(87) PCT Pub. No.: WO2018/074922
PCT Pub. Date: Apr. 26, 2018

(65) Prior Publication Data
US 2020/0189057 A1 Jun. 18, 2020

(30) Foreign Application Priority Data
Oct. 19, 2016 (EP) .................................. 16194666

(51) Int. Cl.
*B23Q 5/58* (2006.01)
*B25J 7/00* (2006.01)
(Continued)

(52) U.S. Cl.
CPC .................................. *B23Q 5/58* (2013.01);
*B25J 7/00* (2013.01); *H02N 2/006* (2013.01);
*H02N 2/025* (2013.01);
(Continued)

(58) Field of Classification Search
CPC .......... H02N 2/006; H02N 2/025; H02N 2/04;
H01J 37/20; H01J 223/20285; B23Q 5/58; B23Q 5/00; G02B 21/26
See application file for complete search history.

(56) References Cited

U.S. PATENT DOCUMENTS

| 7,256,518 | B2 | 8/2007 | Gummin et al. | |
| 7,648,118 | B2 * | 1/2010 | Ukpai | F16K 31/025 251/129.01 |
| 2008/0034749 | A1 | 2/2008 | Ukpai | |

FOREIGN PATENT DOCUMENTS

| CN | 102937430 A | 2/2013 |
| DE | 3227211 A1 | 2/1984 |

(Continued)

OTHER PUBLICATIONS

Search Report in Taiwanese Application No. 106134187 dated Jun. 2, 2021 (1 page).

(Continued)

*Primary Examiner* — Emily P Pham
(74) *Attorney, Agent, or Firm* — Leydig, Voit & Mayer, Ltd.

(57) ABSTRACT

A high-precision linear actuator is described that includes a first straight-guide mechanism that guides movements of an actuator element and a working device relative to an actuator housing. A pressing mechanism that, in a pressing-contact condition, presses the actuator frame and the actuator housing with a predetermined force against one another. A second straight-guide mechanism that guides movements of the actuator housing relative to the actuator frame between the pressing-contact condition and released-contact conditions in which the pressing mechanism presses the actuator frame and the actuator housing towards one another. The high-precision linear actuator provides a safety mechanism automatically reinstates negative consequences of unforeseen (Continued)

collisions in the working environment. In addition the high-precision linear actuator allows for a compact and lightweight design of the actuator element and the working device, which improves operational speed and effectivity of the linear actuator.

2 Claims, 3 Drawing Sheets

(51) Int. Cl.
      *H02N 2/00*     (2006.01)
      *H02N 2/02*     (2006.01)
      *G02B 21/26*    (2006.01)
      *H01J 37/20*    (2006.01)
(52) U.S. Cl.
      CPC ............... *G02B 21/26* (2013.01); *H01J 37/20* (2013.01); *H01J 2237/20285* (2013.01)

(56) References Cited

FOREIGN PATENT DOCUMENTS

| | | |
|---|---|---|
| DE | 102008061666 A1 | 6/2010 |
| FR | 1161411 A | 8/1958 |
| GB | 1146472 A | 3/1969 |
| TW | 201310886 A | 3/2013 |
| WO | WO 2014/096218 A1 | 6/2014 |
| WO | WO 2015/107353 A1 | 7/2015 |

OTHER PUBLICATIONS

European Patent Office, International Search Report in corresponding International Application No. PCT/NL2017/050680, dated Jan. 16, 2018 (3 pages).

* cited by examiner

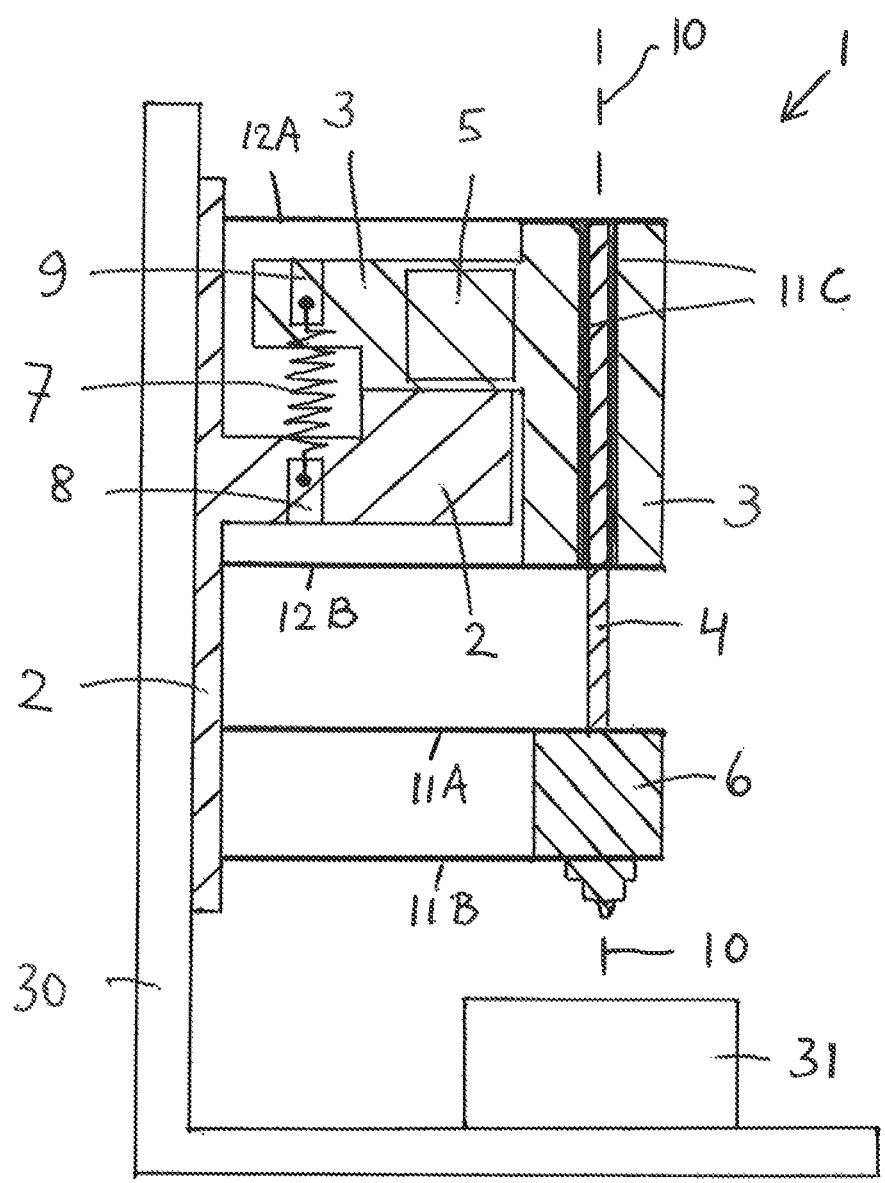

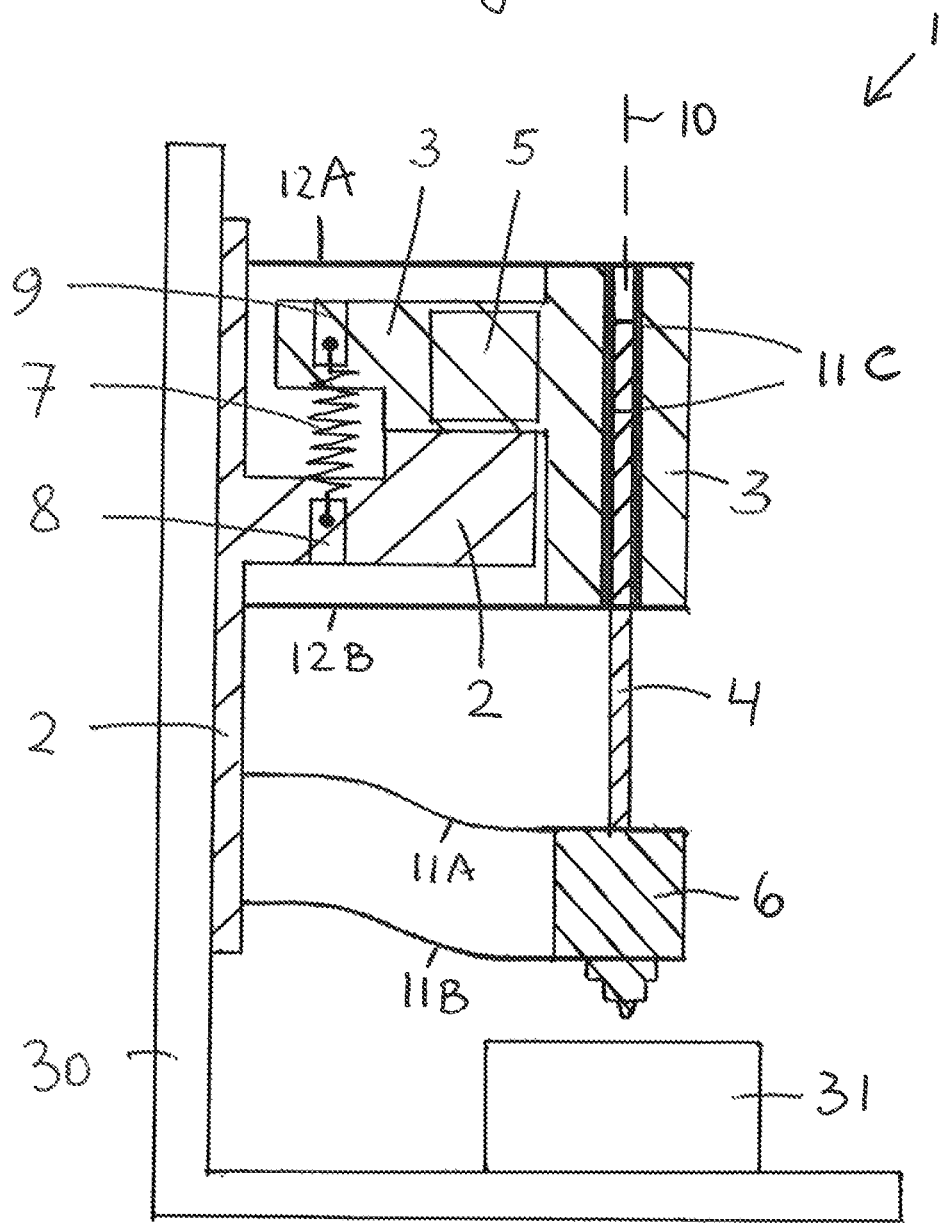

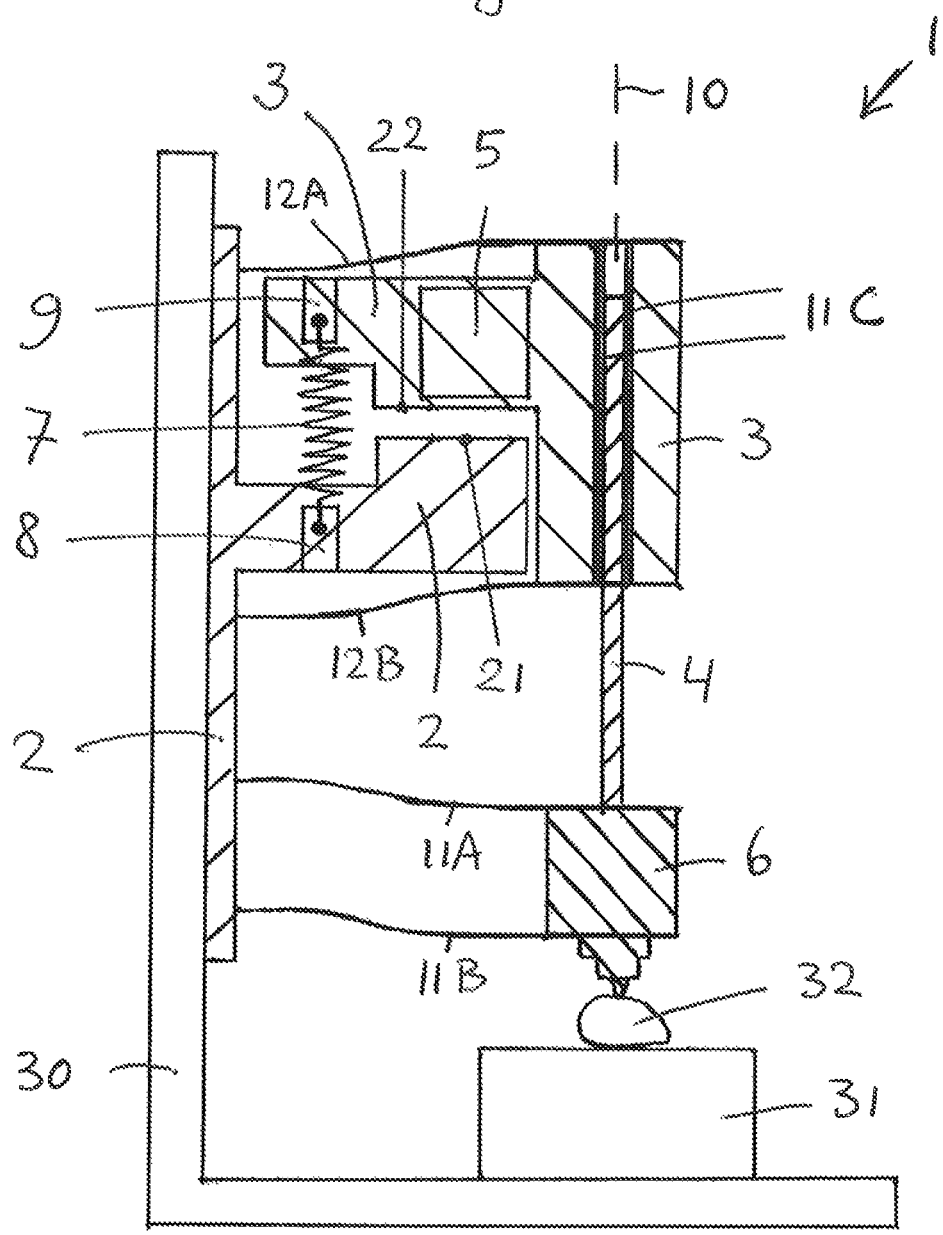

HIGH-PRECISION LINEAR ACTUATOR

CROSS-REFERENCE TO RELATED APPLICATIONS

This patent application is a U.S. National Phase of PCT International Application No, PCT/NL2017/050680, filed Oct. 18, 2017, which claims priority to European Application No. 16194666.0, filed Oct. 19, 2016, which are both expressly incorporated by reference in their entireties, including any references contained therein.

The invention relates to a high-precision linear actuator comprising:
- an actuator frame for being fixedly attached within a working environment;
- an actuator housing;
- an actuator element;
- a first straight-guide mechanism, which moveably connects the actuator element to the actuator housing, and which guides first linear movements of the actuator element relative to the actuator housing parallel to a linear actuator axis of the high-precision linear actuator;
- a driving mechanism for driving said first linear movements;
- a working device for performing tasks within said working environment, wherein the working device is connected to the actuator element so that the working device is moved by the actuator element to also perform said first linear movements.

Such high-precision linear actuators according to the invention are configured for precise motions over relatively short distances (typically in the range of up to a number of millimeters as an order of magnitude), and for positioning with high levels of accuracy (typically down to a micron or less). These high-precision linear actuators are for example used for sample handling in (electron) optical microscopes or atomic force microscopes, for precision motions in semiconductor equipment, or for various other kinds of micro-handling.

When such a linear actuator is working in such a precious high-tech working environment it is important that there is a safety mechanism, which protects both the linear actuator and its working environment against damage due to unforeseen collisions between the moving working device of the linear actuator and parts of the working environment.

For linear actuators there have been proposed safety mechanisms, which employ deliberately designed weak elements that easily break in case of such an unforeseen collision. Such "break elements" absorb the impact of a collision, and may be arranged in the actuator element anchor working device of the linear actuator, such as for example in the connection zone between the actuator element and the working device. When a break element is broken after a collision, it can be replaced by a spare break element.

A drawback of employing one or more break elements as a safety mechanism is that it costs time to replace them when broken. Another drawback is that the presence of the break elements in the actuator element anchor in the working device increases the volume and weight of these moveable parts of the linear actuator, which has a negative effect on the operational speed and effectivity of the high-precision linear actuator.

It is noted that FIG. 1 of US 2008/0034749 A1 discloses a linear actuator of the telescopic type. However, as will be discussed a bit furtheron in the present document, US 2008/0034749 A1 does not disclose a safety mechanism in the sense of the present invention.

It is an object of the present invention to provide a solution according to which negative consequences of unforeseen collisions between the moving working device of the linear actuator and parts of the working environment of the linear actuator are automatically reinstated, while at the same time the moveable parts of the linear actuator can be designed compactly and with light-weight in order to optimize the operational speed and effectivity of the high-precision linear actuator.

For that purpose the invention provides a high-precision linear actuator comprising:
- an actuator frame for being fixedly attached within a working environment;
- an actuator housing;
- an actuator element;
- a first straight-guide mechanism, which moveably connects the actuator element to the actuator housing, and which guides first linear movements of the actuator element relative to the actuator housing parallel to a linear actuator axis of the high-precision linear actuator;
- a driving mechanism for driving said first linear movements;
- a working device for performing tasks within said working environment, wherein the working device is connected to the actuator element so that the working device is moved by the actuator element to also perform said first linear movements;
- a pressing mechanism, which in a pressing-contact condition of the high-precision linear actuator presses the actuator frame and the actuator housing with a predetermined force against one another by pressing contact between a first contact area of the actuator frame and a second contact area of the actuator housing; and
- a second straight-guide mechanism, which moveably connects the actuator housing to the actuator frame, and which guides second linear movements of the actuator housing relative to the actuator frame, parallel to said linear actuator axis and between said pressing-contact condition and released-contact conditions of the high-precision linear actuator, wherein in said released-contact conditions the pressing mechanism presses the actuator frame and the actuator housing towards one another, while the first contact area and the second contact area are not contacting one another then;

characterized in that:
said pressing mechanism and said second straight-guide mechanism are forming a safety mechanism of the high-precision linear actuator in that the pressing mechanism and the second straight-guide mechanism are configured for allowing the high-precision linear actuator to automatically change from its pressing-contact condition into its released-contact conditions in cases where during operation of the linear actuator an unforeseen collision of the working device with an object in the working environment would occur.

Thanks to the pressing mechanism and the second straight-guide mechanism, the high-precision linear actuator according to the invention is allowed to automatically change from its pressing-contact condition into its released-contact conditions in cases where during operation of the linear actuator for example an unforeseen collision of the working device with an object in the working environment would occur.

After the cause of the unforeseen collision and of the consequent change into said released-contact conditions has been removed, the linear actuator according to the invention automatically returns into its pressing-contact condition, thanks to the fact that in said released-contact conditions the pressing mechanism keeps pressing the actuator frame and the actuator housing towards one another. In other words, the invention provides a safety mechanism, which automatically reinstates the negative consequences of an unforeseen collision.

It is furthermore advantageous that the safety mechanism in the form of the pressing mechanism and the second straight-guide mechanism does not have to be incorporated in the moveable parts of the linear actuator, i.e. it does not have to be incorporated in the actuator element and/or in the working device. This means that these moveable parts can be designed compactly and with light-weight in order to optimize the operational speed and effectivity of the linear actuator according to the invention.

In a preferable embodiment of a high-precision linear actuator according to the invention, said pressing mechanism comprises an adjustment mechanism for adjusting said predetermined force.

The abovementioned first and/or second straight-guide mechanisms can be realized in many various ways. For example, straight-guide mechanisms can be applied based on a multiplicity of parallel leaf springs, and/or based on ball/roller guides, and/or based on systems of links/rods, etc., etc.

Also the abovementioned pressing mechanism can be realized in many various ways for pressing the actuator frame and the actuator housing with a predetermined force against/towards one another. For example, pressing mechanisms can be applied based on draw springs, and/or based on compression springs, and/or based on (electro)magnetism, and/or based on fluid pressure differences, and/or based on gravitation, etc., etc.

As mentioned above, FIG. 1 of US 2008/0034749 A1, hereinafter "US '749", discloses a linear actuator of the telescopic type. This linear actuator 10 has the active material components 32, 38, 44, which in the situation of FIG. 1 of US '749 are in their extended conditions. In the shown extended conditions, the stops 24, 22, 20 of the telescopic members 16, 14, 12 are pressing against the members 18, 16, 14, respectively, with the help of the (optional) compression springs 54, 56, 44, respectively. If one of the active material components 32, 38, 44 is heated, it will contract, causing the telescopic linear actuator 10 to slide in, against the action of the compression spring concerned. If one of the active material components 32, 38, 44 is cooled, it will extend, causing the telescopic linear actuator 10 to slide out, with the help of the action of the compression spring concerned.

However, the linear actuator 10 of US '749 does not have the above-explained safety mechanism according to the present invention for cases where during operation of the linear actuator an unforeseen collision of the working device with an object in the working environment would occur.

In the following, the invention is further elucidated with reference to a non-limiting embodiment and with reference to the schematic figures in the attached drawing, in which the following is shown.

FIG. 1 shows in cross-sectional view an example of an embodiment of a high-precision linear actuator according to the invention, arranged within a working environment, and wherein this linear actuator is in its pressing-contact condition.

FIG. 2 shows the situation of FIG. 1 again, however, wherein in FIG. 2 as compared to FIG. 1 the actuator element and the working device of the linear actuator are in a different position relative to the actuator housing, as seen along the linear actuator axis.

FIG. 3 shows the situation of FIG. 2 again, however, wherein in FIG. 3 as compared to FIG. 2 the linear actuator is not in its pressing-contact condition anymore, but in one of its released-contact conditions due to an unforeseen collision of the working device with an unforeseen object in the working environment.

The reference signs used in FIGS. 1-3 are referring to the abovementioned parts and aspects of the invention, as well as to related parts and aspects, in the following manner.

1 high-precision linear actuator
2 actuator frame
3 actuator housing
4 actuator element
5 driving mechanism
6 working device
7 draw spring of pressing mechanism
8, 9 adjustment mechanism of pressing mechanism
10 linear actuator axis
11A, 11B, 11C first straight-guide mechanism
12A, 12B second straight-guide mechanism
21 first contact area
22 second contact area
30, 31, 32 working environment In the shown example the working environment comprises an L-shaped frame 30. At the horizontal bottom wall of this L-shaped frame 30 a high-tech working piece 31 is arranged. Furthermore there is shown, in FIG. 3 only, an unforeseen object 32 as part of the working environment.

The linear actuator 1 is fixedly attached with its actuator frame 2 to the vertical side wall of the L-shaped frame 30 of the working environment. The linear actuator axis 10 is arranged vertically.

The first straight-guide mechanism of the linear actuator 1 comprises a straight-guide in the form of the two parallel leaf springs 11A, 11B, each of which is interconnecting the actuator frame 2 and the working device 6. The first straight-guide mechanism further comprises an additional straight-guide 11C of another suitable type (e.g. a ball/roller guide). This straight-guide 11C is part of the actuator housing 3 and is in engagement with the actuator element 4.

The second straight-guide mechanism of the linear actuator 1 comprises a straight-guide in the form of the two parallel leaf springs 12A, 12B, each of which is interconnecting the actuator frame 2 and the actuator housing 3.

Reference numeral 5 indicates a highly schematically depicted motor (e.g. a piezo stepper motor) of the driving mechanism. The motor 5 drives the first linear movements of the actuator element 4 relative to the actuator housing 3.

In the shown example the pressing mechanism of the linear actuator 1 comprises a draw spring 7, which in the pressing-contact conditions of FIGS. 1, 2 contributes (together with gravitation) to pressing the actuator frame 2 and the actuator housing 3 with a predetermined force against one another. That is, in FIGS. 1 and 2 there is pressing contact between the first contact area 21 of the actuator frame and the second contact area 22 of the actuator housing. It is noted that for reasons of clarity the reference numerals 21, 22 have been omitted in FIGS. 1, 2 (see FIG. 3 for these numerals 21, 22).

In the shown example, said predetermined force is substantially determined by the pre-tension of the draw spring 7 (and for a further part by gravitation). Reference numerals 8, 9 indicate highly schematically depicted means for adjusting the pre-tension of the draw spring 7. These can be means for stretching and relaxing the draw spring 7.

As mentioned, both in FIG. 1 and in FIG. 2 the linear actuator 1 is in its pressing-contact condition. It is seen that in the situation of FIG. 2 the actuator element 4 and the working device 6 have moved a bit downwards as compared to the situation of FIG. 1, without occurrence of any collision in the working area.

It is seen that also in the situation of FIG. 3 the actuator element 4 and the working device 6 have moved a bit downwards as compared to the situation of FIG. 1. This time, however, at a certain point in time during the downwards movement there has occurred an unforeseen collision between the working device 6 and the unforeseen object 32. Due to this collision, the downward movement of the actuator element 4 and the working device 6 has been blocked as from that point in time. Due to this blocking of the downward movement and due to the fact that the motor 5 was still operative at that point in time, the motor 5 in fact has become operative to provide a separation force acting between the actuator housing 3 and the actuator frame 2. Due to the fact that this separation force in the shown example has been higher than the abovementioned predetermined force delivered by the pressing mechanism, the actuator housing 3 has moved a bit upwards relative to the actuator frame 2, as clearly seen in FIG. 3. Accordingly, in FIG. 3 the linear actuator 1 is not in its pressing-contact condition anymore, but in one of its released-contact conditions.

When in the situation of FIG. 3 the cause of the unforeseen collision is removed (i.e. when the object 32 is removed), the linear actuator 1 will automatically return into its pressing-contact condition again, thanks to the fact that in the released-contact conditions the pressing mechanism keeps pressing the actuator frame 2 and the actuator housing 3 towards one another. In other words, the linear actuator 1 has a safety mechanism, which automatically reinstates the negative consequences of the unforeseen collision.

The invention claimed is:

1. A high-precision linear actuator comprising:
    an actuator frame configured for being fixedly attached within a working environment;
    an actuator housing;
    an actuator element;
    a first straight-guide mechanism, which moveably connects the actuator element to the actuator housing, and which guides first linear movements of the actuator element relative to the actuator housing parallel to a linear actuator axis of the high-precision linear actuator;
    a driving mechanism for driving the first linear movements;
    a working device for performing tasks within the working environment, wherein the working device is connected to the actuator element so that the working device is moved by the actuator element to also perform the first linear movements;
    a pressing mechanism that, in a pressing-contact condition of the high-precision linear actuator presses the actuator frame and the actuator housing with a predetermined force against one another by a pressing contact between a first contact area of the actuator frame and a second contact area of the actuator housing; and
    a second straight-guide mechanism that moveably connects the actuator housing to the actuator frame and guides second linear movements of the actuator housing, relative to the actuator frame, parallel to the linear actuator axis and between the pressing-contact condition and a released-contact condition of the high-precision linear actuator, wherein in the released-contact condition the pressing mechanism presses the actuator frame and the actuator housing towards one another, while the first contact area and the second contact area are then not contacting one another,
    wherein the pressing mechanism, the driving mechanism and the second straight-guide mechanism form a safety mechanism of the high-precision linear actuator in that the predetermined force provided by the pressing mechanism, the driving mechanism, and the second straight-guide mechanism are configured such that:
        initially, in accordance with a collision of the working device with an unforeseen object during operation of the driving mechanism in the pressing-contact condition, the driving mechanism automatically commences providing a separation force that is:
            acting between the actuator housing and the actuator frame, and higher than the predetermined force provided by the pressing mechanism, so that the high-precision linear actuator, by the separation force being higher than the predetermined force, automatically changes, via the second linear movements of the actuator housing, from the pressing-contact condition to the released-contact condition, and
        subsequently, in accordance with the unforeseen object being removed, the providing the separation force is automatically stopped, so that the high-precision linear actuator automatically changes, via execution of the second linear movements of the actuator housing relative to the actuator frame, from the released-contact condition to the pressing-contact condition, by operation of the pressing mechanism.

2. The high-precision linear actuator according to claim 1, wherein the pressing mechanism comprises an adjustment mechanism for adjusting the predetermined force.

* * * * *